(12) United States Patent
Ju

(10) Patent No.: US 7,138,584 B1
(45) Date of Patent: Nov. 21, 2006

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/399,318

(22) Filed: Apr. 7, 2006

(51) Int. Cl.
*H05K 9/00* (2006.01)

(52) U.S. Cl. .................. 174/379; 174/377; 174/384; 361/816

(58) Field of Classification Search ............ 174/377, 174/378, 379, 380, 381, 382, 383, 384, 385, 174/386, 387; 361/800, 816, 818
See application file for complete search history.

(56) References Cited

U.S. PATENT DOCUMENTS

| | | | |
|---|---|---|---|
| 6,288,622 B1 * | 9/2001 | Okihara ............ 174/377 |
| 6,320,762 B1 * | 11/2001 | Chen et al. .......... 174/384 |
| 6,377,475 B1 * | 4/2002 | Reis ............... 174/387 |
| 6,384,324 B1 * | 5/2002 | Flegeo ............. 174/390 |
| 6,700,061 B1 * | 3/2004 | Kishimoto ......... 174/377 |
| 6,711,032 B1 * | 3/2004 | Sommer ............ 174/384 |
| 6,744,640 B1 * | 6/2004 | Reis et al. ......... 174/383 |
| 6,870,091 B1 * | 3/2005 | Seidler ............ 174/382 |
| 6,947,295 B1 * | 9/2005 | Hsieh ............. 361/816 |

* cited by examiner

*Primary Examiner*—William H Mayo
*Assistant Examiner*—Adolfo Nino
(74) *Attorney, Agent, or Firm*—Troxell Law Office, PLLC

(57) ABSTRACT

An electrical connector is disclosed to include an electrically insulative housing, which houses a plurality of metal contact pins, each metal contact pin having a bottom bonding face protruding over the bottom side of the housing, a metal shield, which is coupled to the housing and has two bonding portions at two sides, and a bonding adjustment architecture provided between the metal shield and the housing for allowing vertical movement of the metal shield relative to the housing to adjust the elevation of the bonding portions so that the bonding portions and the bonding face of each metal contact pin can be positively bonded to a circuit board by SMT.

16 Claims, 3 Drawing Sheets

ELECTRICAL CONNECTOR

BACKGROUND OF THE INVENTION

1. Field of the Invention

The present invention relates to an electrical connector and more particularly, to an electrical connector, which has a metal shield that is vertically adjustable relative to the electrically insulative housing of the electrical connector so that the electrical connector can positively be bonded to a circuit board by SMT (Surface Mounting Technique).

2. Description of the Related Art

An electrical connector for high frequency communication generally has a metal shield covered on the electrically insulative housing to protect the internal metal contact pins against EMI (Electromagnetic Interference).

According to conventional designs, the metal shield and the electrically insulative housing are fixedly fastened together, i.e., the metal shield is not movable relative to the electrically insulative housing and the electrically insulative housing is not movable relative to the metal shield. When bonding a conventional electrical connector to a circuit board, the bonding portions of the metal shield may be not kept in contact with the corresponding bonding portions of the circuit board due to deformation of the electrically insulative housing or the metal shield, thereby affecting the bonding quality.

Therefore, it is desirable to provide an electrical connector that eliminates the aforesaid problem.

SUMMARY OF THE INVENTION

The present invention has been accomplished under the circumstances in view. It is one object of the present invention to provide an electrical connector, which allows vertical movement of the metal shield relative to the electrically insulative housing so that so that the bonding portions of the metal shield and the bonding face of each metal contact pin in the electrically insulative housing can positively be bonded to a circuit board by SMT (Surface Mounting Technique).

According to one embodiment of the present invention, the electrical connector comprises an electrically insulative housing, the electrically insulative housing having two guide blocks respectively protruded from two opposite sides thereof; at least one metal contact pin respectively mounted in the electrically insulative housing, the at least one metal contact pin having a bottom bonding face protruding over a bottom side of the electrically insulative housing for bonding to a circuit board; and shield means capped on the electrically insulative housing and vertically movable relative to the electrically insulative housing, the shield means having two vertical sliding slots disposed at two sides and respectively coupled to the guide blocks of the electrically insulative housing to guide vertical movement of the shield means relative to the electrically insulative housing within a limited distance, and two bottom bonding portions disposed at two sides for bonding to the circuit board to which the bonding face of each of the at least one metal contact pin is bonded.

According to another embodiment of the present invention, the electrical connector comprises an electrically insulative housing, the electrically insulative housing having two guide blocks respectively protruded from two opposite sides thereof; at least one metal contact pin respectively mounted in the electrically insulative housing, the at least one metal contact pin having a bottom bonding face protruding over a bottom side of the electrically insulative housing for bonding to a circuit board; and shield means capped on the electrically insulative housing, the shield means having two bonding portions disposed at two sides, the bottom bonding portions each having a bonding hole and a solder material mounted in the bonding hole for bonding to the circuit board to which the bonding face of each of the at least one metal contact pin is bonded.

DETAILED DESCRIPTION OF THE PREFERRED EMBODIMENT

Figure 1:
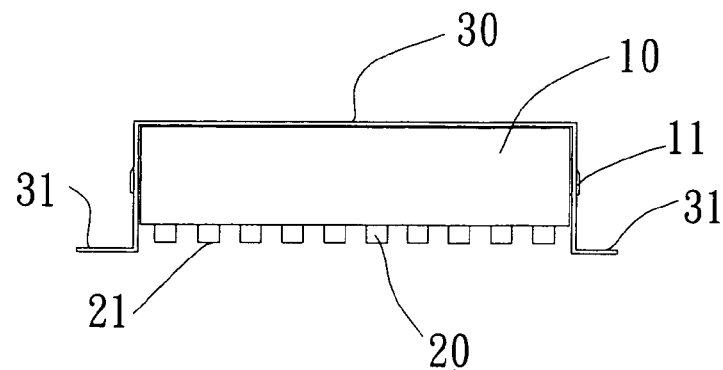
FIG. 1 is a schematic front view of an electrical connector in accordance with a first embodiment of the present invention.
Figure 2:
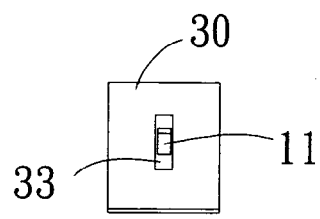
FIG. 2 is an enlarged view of a part of FIG. 1, showing one guide block of the electrically insulative housing inserted through the associating vertical sliding slot of the metal shield.
Figure 3:
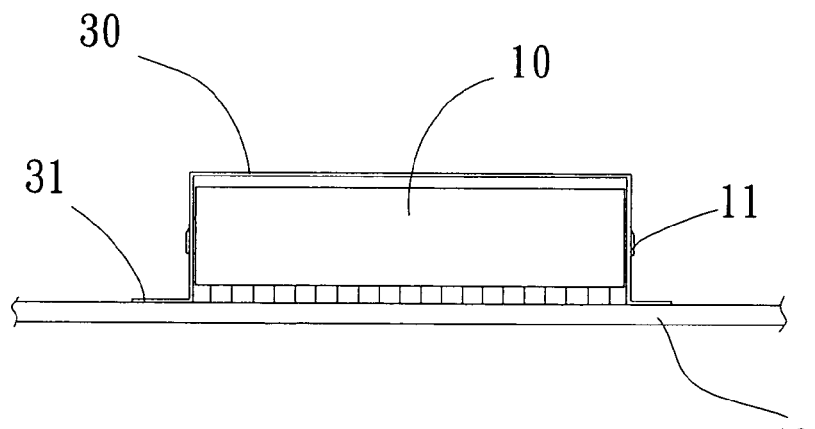
FIG. 3 is a schematic drawing showing the electrical connector of the first embodiment of the present invention bonded to a circuit board.

Referring to FIGS. 1~3, an electrical connector in accordance with a first embodiment of the present invention is shown bonded to a circuit board 40 by SMT (Surface Mounting Technique). The electrical connector comprises an electrically insulative housing 10, a plurality of metal contact pins 20, and a metal shield 30.

The metal contact pins 20 are mounted in the electrically insulative housing 10, each having a bonding face 21 soldered to the circuit board 40. The metal shield 30 is capped on the electrically insulative housing 10, having two bonding portions 31 respectively outwardly extending from the bottom of two opposite vertical sidewalls thereof at right angles and two vertical sliding slots 33 respectively formed on the two opposite vertical sidewalls. The electrically insulative housing 10 has two guide blocks 11 respectively protruded from the two opposite vertical sidewalls thereof and respectively engaged into the vertical sliding slots 33 of the metal shield 30 so that the metal shield 30 can be moved vertically up and down relative to the electrically insulative housing 10 within a distance corresponding to the length of the vertical sliding slots 33.

Before bonding the bonding portions 31 of the metal shield 30 to the circuit board 40, the metal shield 30 can be moved vertically relative to the electrically insulative housing 10. When moved the metal shield 30 downwards relative to the electrically insulative housing 10 to the lower limit, the bonding portions 31 (the bottom side) of the metal shield 30 are suspending below the elevation of the bonding face 21 of each metal contact pin 20. On the contrary, when moved the metal shield 30 upwards relative to the electrically insulative housing 10 to the upper limit, the bonding portions 31 (the bottom side) of the metal shield 30 are suspending above the elevation of the bonding face 21 of each metal contact pin 20. This relatively movable design between the metal shield 30 and the electrically insulative housing 10 constitutes a bonding adjustment architecture.

When bonding the electrical connector to the circuit board 40, the aforesaid bonding adjustment architecture allows adjustment of the elevation of the bonding portions 31 of the metal shield 30 relative to the bonding faces 21 of the metal contact pins 31 so that the bonding portions 31 of the metal shield 30 and the bonding faces 21 of the metal contact pins 31 can be positively soldered to the circuit board 40.

Figure 4:
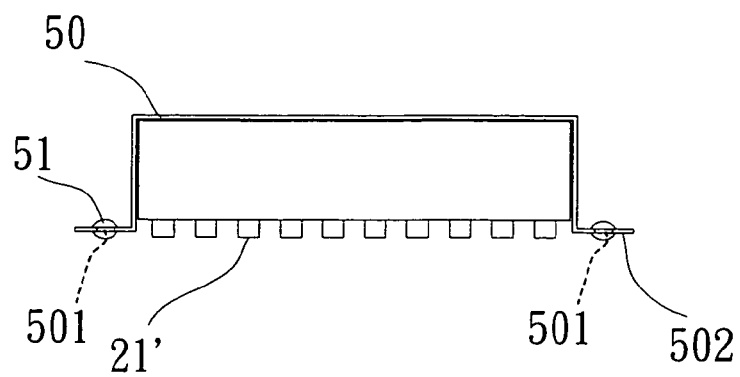
FIG. 4 is a schematic front view of an electrical connector in accordance with a second embodiment of the present invention.
Figure 5:
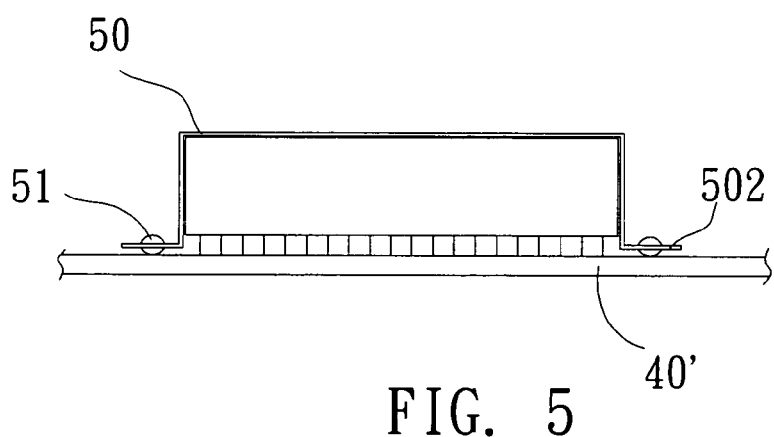
FIG. 5 is a schematic drawing showing the electrical connector of the second embodiment of the present invention bonded to a circuit board.

FIGS. 4 and 5 show an electrical connector in accordance with a second embodiment of the present invention. According to this embodiment, the metal shield 50 has a plurality of bonding legs 502 perpendicularly outwardly extending from the bottom of the vertical peripheral wall thereof at an elevation slightly above each metal contact pin's bonding face 21'. Each bonding leg 502 has a bonding hole 501 (not shown) that holds a solder material, for example, a solder ball 51. The solder ball 51 is positioned in the associating bonding hole 501 by a mechanical mechanism. By means of friction resistance, the solder ball 51 is firmly secured to the associating bonding hole 501. According to this embodiment, the metal shield 50 is not movable relative to the electrically insulative housing of the electrical connector. The solder balls 51 in the bonding holes 501 of the bonding legs 502 of the metal shield 50 constitute a bonding adjustment architecture. When the solder balls 51 are melted, the molten solder is lowered and bonded to the circuit board 40'.

Figure 6:
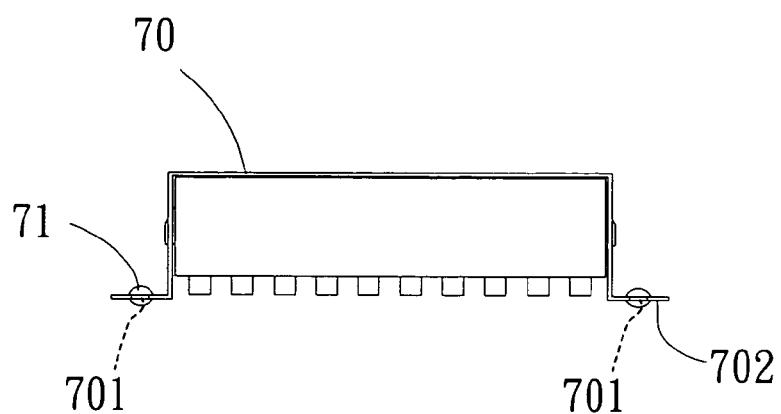
FIG. 6 is a schematic front view of an electrical connector in accordance with a third embodiment of the present invention.
Figure 7:
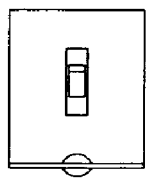
FIG. 7 is an enlarged view of a part of FIG. 6, showing one guide block of the electrically insulative housing inserted through the associating vertical sliding slot of the metal shield.
Figure 8:
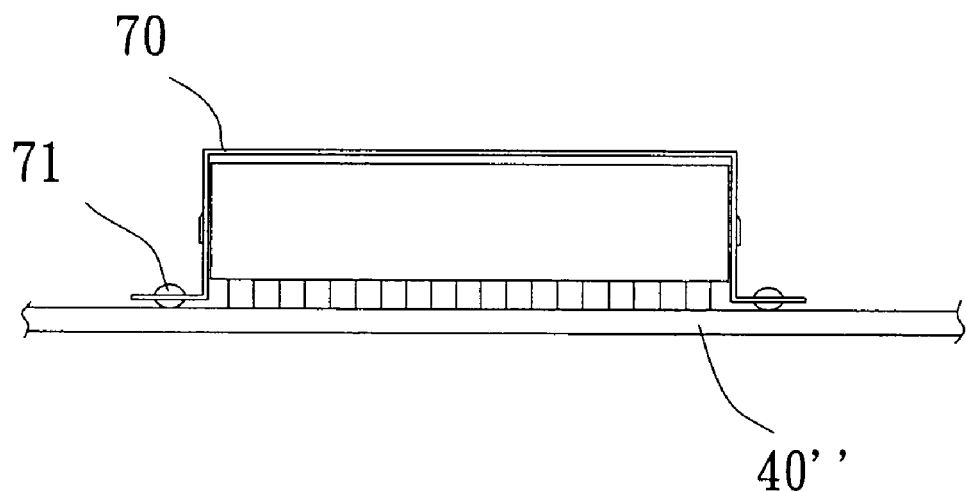
FIG. 8 is a schematic drawing showing the electrical connector of the third embodiment of the present invention bonded to a circuit board.

FIGS. 6~8 show an electrical connector in accordance with a third embodiment of the present invention. This embodiment is substantially similar to the aforesaid first embodiment of the present invention with the exception that the metal shield 70 has a plurality of bonding legs 702 perpendicularly outwardly extending from the bottom of the vertical peripheral wall thereof. Each bonding leg 702 has a bonding hole 701 (not shown) that holds a solder material, for example, a solder ball 71. The solder ball 71 is positioned in the associating bonding hole 701 by a mechanical mechanism. By means of friction resistance, the solder ball 71 is firmly secured to the associating bonding hole 701. According to this embodiment, the metal shield 70 is vertically movable relative to the electrically insulative housing of the electrical connector. During installation, the solder balls 71 are bonded to the circuit board 40".

As indicated above, the invention provides an electrical connector, which comprises an electrically insulative housing that houses a plurality of metal contact pins, and a metal shield caped on the electrically insulative housing and providing a bonding adjustment architecture that allows the metal contact pins and the metal shield to be positively bonded to a circuit board by SMT.

A prototype of electrical connector has been constructed with the features of FIGS. 1~8. The electrical connector functions smoothly to provide all of the features disclosed earlier.

Although particular embodiments of the invention have been described in detail for purposes of illustration, various modifications and enhancements may be made without departing from the spirit and scope of the invention. Accordingly, the invention is not to be limited except as by the appended claims.

The invention claimed is:

1. An electrical connector comprising:
   an electrically insulative housing, said electrically insulative housing having two guide blocks respectively protruded from two opposite sides thereof;
   at least one metal contact pin respectively mounted in said electrically insulative housing, said at least one metal contact pin each having a bottom bonding face protruding over a bottom side of said electrically insulative housing for bonding to a circuit board; and
   shield means capped on said electrically insulative housing and vertically movable relative to said electrically insulative housing, said shield means having two vertical sliding slots disposed at two sides and respectively coupled to the guide blocks of said electrically insulative housing to guide vertical movement of said shield means relative to said electrically insulative housing within a limited distance, and two bottom bonding portions disposed at two sides for bonding to the circuit board to which the bonding face of each of said at least one metal contact pin is bonded.

2. The electrical connector as claimed in claim 1, wherein said guide blocks of said electrically insulative housing guide vertical movement of said shield means between a first position where said bonding portions are suspending at an elevation below the bonding face of each of said at least one metal contact pin and a second position where said bonding portions are suspending at an elevation above the bonding face of each of said at least one metal contact pin.

3. The electrical connector as claimed in claim 1, wherein said shield means is a metal shell.

4. The electrical connector as claimed in claim 3, wherein said bonding portions each have a bonding hole.

5. The electrical connector as claimed in claim 4, wherein said bonding hole holds a solder material.

6. The electrical connector as claimed in claim 5, wherein said bonding material is a solder ball.

7. The electrical connector as claimed in claim 5, wherein said solder material is positioned in said bonding hole by means of a mechanical mechanism.

8. An electrical connector comprising:
   an electrically insulative housing, said electrically insulative housing having two guide blocks respectively protruded from two opposite sides thereof;
   at least one metal contact pin respectively mounted in said electrically insulative housing, said at least one metal contact pin each having a bottom bonding face protruding over a bottom side of said electrically insulative housing for bonding to a circuit board; and
   shield means capped on said electrically insulative housing, said shield means having two bonding portions disposed at two sides, said bottom bonding portions each having a bonding hole and a solder material mounted in said bonding hole for bonding to the circuit board to which the bonding face of each of said at least one metal contact pin is bonded.

9. The electrical connector as claimed in claim 8, wherein said solder material has a bottom side disposed at an elevation not lower than the elevation of the bonding face of each of said at least one metal contact pin.

10. The electrical connector as claimed in claim 8, wherein said solder material is a solder ball.

11. The electrical connector as claimed in claim 10, wherein said solder ball is positioned in said bonding hole by means of a mechanical mechanism.

12. The electrical connector as claimed in claim 8, wherein said shield means is a metal shell.

13. The electrical connector as claimed in claim 12, wherein said electrically insulative housing has two guide blocks disposed at two opposite sides for guiding vertical movement of said shield means relative to said electrically insulative housing.

14. The electrical connector as claimed in claim 13, wherein said shield means has two vertical sliding slots disposed at two sides and respectively coupled to the guide blocks of said electrically insulative housing.

15. The electrical connector as claimed in claim 14, wherein said shield means is movable vertically relative to said electrically insulative housing between a first position where said bonding portions are suspending at an elevation below the bonding face of each of said at least one metal contact pin and a second position where said bonding portions are suspending at an elevation above the bonding face of each of said at least one metal contact pin.

16. The electrical connector as claimed in claim 8, wherein said bonding portions are respectively perpendicularly extending from a bottom side of said shield means in reversed directions.

* * * * *